US010199369B2

(12) United States Patent
Parthasarathy et al.

(10) Patent No.: US 10,199,369 B2
(45) Date of Patent: Feb. 5, 2019

(54) APPARATUS AND METHODS FOR ACTIVELY-CONTROLLED TRANSIENT OVERSTRESS PROTECTION WITH FALSE CONDITION SHUTDOWN

(71) Applicant: ANALOG DEVICES, INC., Norwood, MA (US)

(72) Inventors: Srivatsan Parthasarathy, Acton, MA (US); Javier Alejandro Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 297 days.

(21) Appl. No.: 15/060,932

(22) Filed: Mar. 4, 2016

(65) Prior Publication Data

US 2017/0256534 A1    Sep. 7, 2017

(51) Int. Cl.
*H01L 27/02* (2006.01)
*H02H 9/04* (2006.01)
*H03K 17/30* (2006.01)

(52) U.S. Cl.
CPC ...... *H01L 27/0285* (2013.01); *H01L 27/0259* (2013.01); *H02H 9/04* (2013.01); *H02H 9/046* (2013.01); *H03K 17/305* (2013.01)

(58) Field of Classification Search
USPC .......................................... 361/56, 91.1, 111
See application file for complete search history.

(56) References Cited

U.S. PATENT DOCUMENTS 5,719,733 A    2/1998    Wei et al.
5,748,425 A    5/1998    Gutsch et al.
(Continued)

FOREIGN PATENT DOCUMENTS

CN    201536104 U    7/2010
CN    102118024 A    7/2011
(Continued)

OTHER PUBLICATIONS

Salcedo et al., Electrostatic Discharge Protection Framework for Mixed-Signal High Voltage CMOS Applications. 9th International Conference on Solid-State and Integrated-Circuit Technology, Oct. 2008. 4 pages.
Salcedo et al., Monolithic ESD Protection for Distributed High Speed Applications in 28-nm CMOS Technology, IEEE 2014, 4 pages.
Office Action issued in corresponding Chinese Patent Application No. 201710123178.9 dated Jul. 17, 2018.

*Primary Examiner* — Danny Nguyen
(74) *Attorney, Agent, or Firm* — Knobbe, Martens, Olson & Bear, LLP

(57) ABSTRACT

Apparatus and methods for transient overstress protection with false condition shutdown are provided herein. In certain configurations, a high-voltage tolerant actively-controlled protection circuit includes a transient overstress detection circuit, a clamp circuit electrically connected between a first node and a second node, a bias circuit that biases the clamp circuit, and a false condition shutdown circuit. The transient overstress detection circuit generates a detection signal indicating whether or not a transient overstress event is detected between the first and second nodes. Additionally, the false condition shutdown circuit generates a false condition shutdown signal based on low pass filtering a voltage difference between the first and second nodes, thereby determining independently whether or not power is present. The bias circuit controls operation of the clamp circuit in an on state or an off state based on the detection signal and the false condition shutdown signal.

20 Claims, 9 Drawing Sheets

(56) References Cited

U.S. PATENT DOCUMENTS

| | | |
|---|---|---|
| 5,835,328 A | 11/1998 | Maloney et al. |
| 5,870,268 A | 2/1999 | Lin et al. |
| 5,973,341 A | 10/1999 | Letavic et al. |
| 6,429,489 B1 | 8/2002 | Botula et al. |
| 6,442,008 B1 | 8/2002 | Anderson |
| 6,614,633 B1 | 9/2003 | Kohno |
| 7,064,393 B2 | 6/2006 | Mergens et al. |
| 7,102,862 B1 | 9/2006 | Lien et al. |
| 7,106,563 B2 | 9/2006 | Lai et al. |
| 7,285,828 B2 | 10/2007 | Salcedo et al. |
| 7,566,914 B2 | 7/2009 | Salcedo et al. |
| 7,601,991 B2 | 10/2009 | Salcedo et al. |
| 7,706,113 B1 | 4/2010 | Lien et al. |
| 7,738,222 B2 | 6/2010 | Deutschmann et al. |
| 8,044,457 B2 | 10/2011 | Salcedo et al. |
| 8,222,698 B2 | 7/2012 | Salcedo et al. |
| 8,320,091 B2 | 11/2012 | Salcedo et al. |
| 8,345,394 B2 | 1/2013 | Zhao et al. |
| 8,368,116 B2 | 2/2013 | Salcedo et al. |
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,462,477 B2 | 6/2013 | Modica et al. |
| 8,466,489 B2 | 6/2013 | Salcedo et al. |
| 8,553,380 B2 | 10/2013 | Salcedo |
| 8,564,065 B2 | 10/2013 | Donovan et al. |
| 8,582,261 B2 | 11/2013 | Salcedo et al. |
| 8,592,860 B2 | 11/2013 | Salcedo et al. |
| 8,610,251 B1 | 12/2013 | Salcedo |
| 8,637,899 B2 | 1/2014 | Salcedo |
| 8,649,134 B2 | 2/2014 | Smith |
| 8,665,571 B2 | 3/2014 | Salcedo et al. |
| 8,680,620 B2 | 3/2014 | Salcedo et al. |
| 8,723,227 B2 | 5/2014 | Salcedo et al. |
| 8,730,630 B2 | 5/2014 | Parthasarathy et al. |
| 8,773,826 B2 | 7/2014 | Althlaguirre et al. |
| 8,796,729 B2 | 8/2014 | Clarke et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |
| 9,006,781 B2 | 4/2015 | Salcedo et al. |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,184,098 B2 | 11/2015 | Salcedo et al. |
| 9,275,991 B2 | 3/2016 | Salcedo et al. |
| 9,293,912 B2 | 3/2016 | Parthasarathy et al. |
| 9,478,608 B2 | 10/2016 | Salcedo et al. |
| 9,634,482 B2 | 4/2017 | Parthasarathy et al. |
| 2002/0153571 A1 | 10/2002 | Mergens et al. |
| 2004/0114288 A1 | 6/2004 | Cheng et al. |
| 2006/0103998 A1 | 5/2006 | Smith |
| 2006/0285418 A1 | 12/2006 | Aoki |
| 2007/0076338 A1 | 4/2007 | Traynor et al. |
| 2008/0106837 A1 | 5/2008 | Jang |
| 2008/0247102 A1 | 10/2008 | Vinson |
| 2008/0304191 A1 | 12/2008 | Riviere et al. |
| 2008/0316659 A1 | 12/2008 | Oguzman et al. |
| 2010/0148797 A1 | 6/2010 | Ker et al. |
| 2010/0149701 A1* | 6/2010 | Drapkin ............. H01L 27/0285 361/56 |
| 2010/0214706 A1 | 8/2010 | Crespo et al. |
| 2010/0328827 A1* | 12/2010 | Lai ........................ H02H 9/046 361/56 |
| 2011/0222196 A1 | 9/2011 | Smith |
| 2011/0235228 A1 | 9/2011 | Salcedo et al. |
| 2012/0002337 A1 | 1/2012 | Parthasarathy et al. |
| 2012/0057260 A1 | 3/2012 | Poulton |
| 2012/0180008 A1 | 7/2012 | Gist et al. |
| 2012/0257317 A1 | 10/2012 | Abou-Khalil et al. |
| 2013/0155558 A1 | 6/2013 | Bourgeat et al. |
| 2014/0078624 A1 | 3/2014 | Nagamatsu et al. |
| 2014/0133055 A1 | 5/2014 | Parthasarathy et al. |
| 2014/0185168 A1* | 7/2014 | Kunz, Jr. ............... H02H 9/046 361/56 |
| 2014/0355157 A1* | 12/2014 | Huang ................... H02H 9/046 361/56 |
| 2016/0020603 A1 | 1/2016 | Parthasarathy et al. |
| 2016/0087429 A1 | 3/2016 | Wang et al. |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0336740 A1 | 11/2016 | Parthasarathy et al. |
| 2016/0336744 A1 | 11/2016 | Parthasarathy et al. |
| 2017/0243862 A1 | 8/2017 | Parthasarathy et al. |
| 2017/0256534 A1 | 9/2017 | Parthasarathy et al. |
| 2017/0317070 A1 | 11/2017 | Salcedo et al. |
| 2017/0366002 A1 | 12/2017 | Zhao et al. |
| 2018/0026440 A1 | 1/2018 | Zhao et al. |
| 2018/0158814 A1 | 6/2018 | Salcedo et al. |

FOREIGN PATENT DOCUMENTS

| | | |
|---|---|---|
| CN | 103217720 A | 7/2013 |
| CN | 103248033 A | 8/2013 |
| CN | 103915828 A | 7/2014 |
| EP | 1617477 A1 | 1/2006 |
| EP | 1048078 B1 | 5/2010 |
| TW | 577166 B | 2/2004 |
| WO | WO 2009/050641 | 4/2009 |
| WO | WO 2014/180184 A1 | 11/2014 |

* cited by examiner

US 10,199,369 B2

APPARATUS AND METHODS FOR ACTIVELY-CONTROLLED TRANSIENT OVERSTRESS PROTECTION WITH FALSE CONDITION SHUTDOWN

BACKGROUND

Field

Embodiments of the invention relate to electronic systems, and more particularly, to actively-controlled transient overstress protection circuits.

Description of the Related Technology

Certain electronic systems can be exposed to transient overstress events, or electrical signals of short duration having rapidly changing voltage and high power. Transient overstress events can include, for example, electrostatic discharge (ESD) events arising from the abrupt release of charge from an object or person to an electronic system.

Transient overstress events can damage or destroy integrated circuits (ICs) due to overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY

In one aspect, an integrated circuit is provided. The integrated circuit includes a transient overstress detection circuit configured to generate a detection signal based on detecting a presence of a transient overstress event between a first node and a second node, a clamp circuit having an on state and an off state and electrically connected between the first node and the second node, a false condition shutdown circuit configured to detect when the integrated circuit is powered, and a bias circuit. The false condition shutdown circuit is configured to generate a false condition shutdown signal based on low pass filtering a voltage difference between the first node and the second node, and the bias circuit is configured to control operation of the clamp circuit in the on state or the off state based on the detection signal and the false condition shutdown signal.

In another aspect, a method for protecting an integrated circuit from electrical overstress is provided. The method includes detecting a presence of a transient overstress event between a first node and a second node using a transient overstress detection circuit, activating a detection signal in response to detecting the presence of the transient overstress event using the transient overstress detection circuit, generating a false condition shutdown signal based on low pass filtering a voltage difference between the first node and the second node using a false condition shutdown circuit, turning on a clamp circuit using a bias circuit when the detection signal is activated and the false condition shutdown signal is deactivated, and turning off the clamp circuit using the bias circuit when the false condition shutdown signal is activated.

In another aspect, a data converter system on a chip (SOC) is provided. The data converter SOC includes an analog-to-digital converter (ADC) that receives power from a supply voltage node and a ground node, and a supply clamp. The supply clamp includes a transient overstress detection circuit configured to generate a detection signal based on detecting a presence of a transient overstress event between the supply voltage node and the ground node, a clamp circuit having an on state and an off state and electrically connected between the supply voltage node and the ground node, a false condition shutdown circuit configured to generate a false condition shutdown signal based on low pass filtering a voltage difference between the supply voltage node and the ground node, and a bias circuit configured to control operation of the clamp circuit in the on state or the off state based on the detection signal and the false condition shutdown signal.

DETAILED DESCRIPTION OF EMBODIMENTS

Figure 1A:
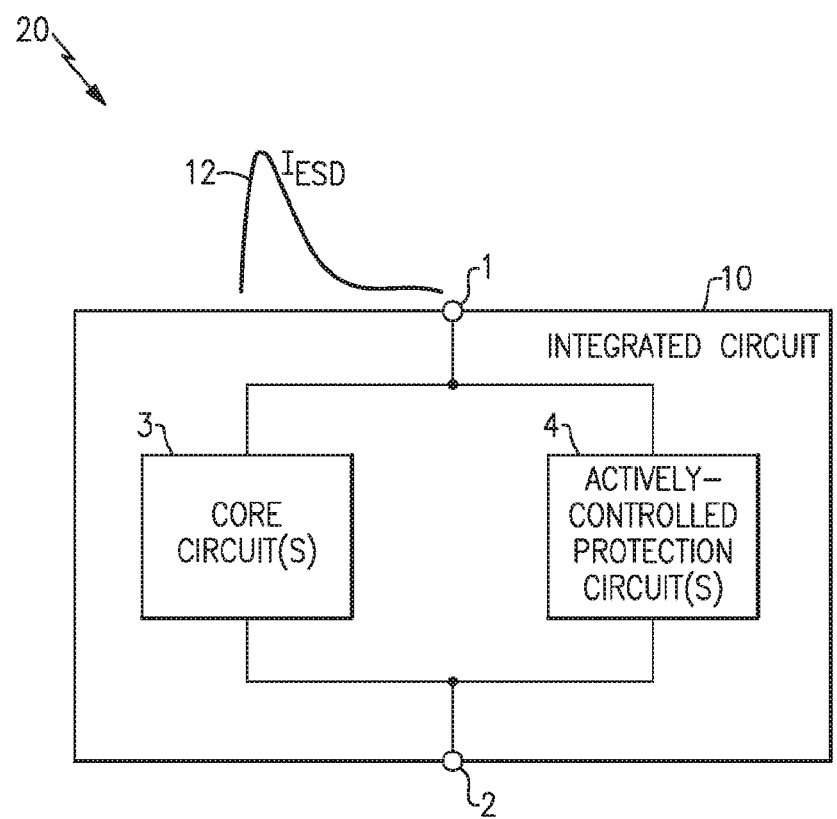
FIG. 1A is a schematic diagram of an electronic system in accordance with one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Certain electronic systems include overstress protection circuits to protect circuits or components from transient overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient overstress events, including electrostatic discharge (ESD) events.

An actively-controlled protection circuit is a type of overstress protection circuit that includes a transient overstress detection circuit and a clamp circuit. The transient overstress detection circuit detects for the presence of a transient overstress event by monitoring for electrical conditions associated with overstress. The transient overstress detection circuit generates a detection signal indicating whether or not a transient overstress event is detected, and the detection signal is used to selectively activate the clamp circuit. Thus, an actively-controlled protection circuit can be turned on without needing to rely on direct junction breakdown of the clamp circuit to provide clamping. Actively-controlled protection circuits can provide relatively fast activation times, relatively low static power dissipation, and/or relatively compact area for a given amount of overstress protection.

Apparatus and methods for transient overstress protection with false condition shutdown are provided herein. In certain configurations, an actively-controlled protection circuit includes a transient overstress detection circuit, a clamp circuit electrically connected between a first node and a second node, a bias circuit that biases the clamp circuit, and a false condition shutdown circuit. The transient overstress detection circuit generates a detection signal indicating whether or not a transient overstress event is detected between the first and second nodes. Additionally, the false condition shutdown circuit generates a false condition shutdown signal based on low pass filtering a voltage difference between the first and second nodes, thereby determining whether or not power is present. The bias circuit controls operation of the clamp circuit in an on state or an off state based on the detection signal and the false condition shutdown signal.

Including the false condition shutdown circuit can enhance the robustness of the actively-controlled protection circuit. For example, the false condition shutdown circuit generates the false condition shutdown signal based on the voltage difference between the first and second nodes, and thus can be used to detect when an IC is powered. When the voltage difference corresponds to a nominal operating voltage between the first and second nodes, the false condition shutdown circuit controls the false condition shutdown signal to a value that inhibits the bias circuit from activating the clamp circuit. Thus, the false condition shutdown signal inhibits the bias circuit from turning on the clamp circuit when the IC is powered. Moreover, when the clamp circuit is inadvertently activated by high power/high speed switching, the false condition shutdown signal deactivates the clamp circuit, thereby preventing the clamp circuit from remaining turned on after unintended activation.

The false condition shutdown circuit can remedy unintended activation of the clamp circuit when an IC is powered by shutting down the clamp circuit after the clamp circuit has been inadvertently activated by high power/high speed signaling conditions. For instance, transient switching associated with advanced high power converter applications may inadvertently trigger activation of the clamp circuit, and the false condition shutdown circuit can be used to deactivate the clamp circuit after unintended activation. In contrast, an actively-controlled protection circuit implemented without a false condition shutdown circuit may be accidentally triggered and remain turned on indefinitely.

The teachings herein can be used to provide an actively-controlled protection circuit that is suitable to provide ESD protection for integrated circuits, systems on-a-chip (SoC), systems-in-package (SiP) or systems-on-a-board (SoB) implemented using a wide variety of fabrication processes, such as advanced complementary metal oxide semiconductor (CMOS) technologies and/or bipolar complementary metal oxide semiconductor (BiCMOS) technologies. Additionally, the actively-controlled protection circuits described herein are suitable to operate as a power supply clamp, and can provide high voltage tolerance to multi-level power domains. The false condition shutdown provides robust ESD protection in a wide range of applications, including, for example, high power/high speed data conversion applications.

In certain configurations, the actively-controlled protection circuit further includes a sense feedback circuit, which provides feedback that controls turn on characteristic of the clamp circuit. In certain implementations, the sense feedback circuit provides current-feedback to an input of the bias circuit, such as by providing positive feedback that is based on detecting a current flowing through the clamp circuit. The positive feedback can maintain the clamp circuit turned on for a full duration of an ESD event, thereby provident ESD protection independent of a resistor-capacitor (RC) time constant of a transient overstress detection circuit. Thus, the sense feedback circuit can provide robust control over activation of the clamp circuit's clamping elements.

Certain transient overstress protection circuits, such as those implemented using bipolar/CMOS supply clamps in CMOS/BiCMOS manufacturing processes, exhibit an inability to be activated for an entire duration of a transient overstress event. However, it can be problematic when an overstress protection circuit is not turned on for a full duration of a transient overstress event, since a trailing edge of the transient overstress event can nevertheless cause damage. For instance, high speed MOS devices, such as those having a gate length of 28 nm or less, and/or high speed bipolar devices, such as silicon-germanium (SiGe) bipolar junction transistors (BJTs), can be damaged by a trailing edge of an ESD event.

By providing positive feedback based on sensing a current through the clamp circuit, the transient overstress event including the trailing edge can be safely discharged while avoiding voltage build-up.

The clamp circuit can be implemented using a wide variety of clamp elements suitable for providing high power/high current handling capability. In certain configurations, the clamp element can include at least one of a MOS transistor, a controllable silicon controlled rectifier (SCR) device, or a bipolar transistor. In certain implementations, the clamp circuit can include a cascade of clamp elements, including, but not limited to, a cascade of MOS transistors, a cascade of bipolar transistors, a cascade of SCR devices, a cascade of a MOS transistor and an SCR device, a cascade of a bipolar transistor and an SCR device, or a cascade of a MOS transistor and a bipolar transistor.

FIG. 1A is a schematic diagram of an electronic system 20 in accordance with one embodiment. The illustrated electronic system 20 includes an integrated circuit (IC) 10. As shown in FIG. 1, the IC 10 includes a first pin 1, a second pin 2, a core or internal circuit 3, and an actively-controlled protection circuit 4. Although FIG. 1A illustrates an embodiment including two pins, one core circuit, and one protection circuit, the IC 10 can be adapted to include additional pins, core circuits, protection circuits, and/or other structures.

The core circuit 3 can include one or more circuits of various functionalities within a common substrate or separate substrate, and is electrically connected to one or more of the pins 1, 2. The pins 1, 2 can be used for a variety of purposes, including, for example, data communication and/or providing power or ground to the IC 10.

In a first example, the first pin 1 is a power supply pin and the second pin 2 is a ground pin. In a second example, the first pin 1 is a power supply pin of a first voltage domain and the second pin 2 is a power supply pin of a second voltage domain. In a third example, the first pin 1 is a reference voltage pin and the second pin 2 is a ground pin. In a fourth example, the first pin 1 is a power supply pin and the second pin 2 is a reference voltage pin. In a fifth example, the first pin 1 is a first reference voltage pin and the second pin 2 is a second reference voltage pin.

The IC 10 can be exposed to transient overstress events, such as ESD events, which can cause IC damage and/or induce latch-up. For example, the first pin 1 can receive a transient overstress event 12, which can travel along electrical connections of the IC 10 and reach the core circuit 3. The transient overstress event 12 can produce overvoltage conditions and can dissipate high levels of power, which can disrupt the functioning of the core circuit 3 and potentially cause permanent damage.

The actively-controlled protection circuit 4 can be provided to enhance reliability of the IC 10. As described in detail herein, when the actively-controlled protection circuit 4 detects presence of a transient overstress event between the first and second pins 1, 2, the actively-controlled protection circuit 4 shunts a current associated with the transient overstress event to provide overstress protection.

Thus, actively-controlled protection circuits can be employed on an IC, such as the IC 10 of FIG. 1A. The actively-controlled protection circuits can be provided alone or in combination with other protection circuitry to provide the desired degree of protection against various transient overstress events. For example, an IC can include a number of input pins, output pins, bi-directional pins, power high pins, and power low or ground pins, and one or more of these pins can be protected using actively-controlled protection circuits.

In the illustrated embodiment, the actively-controlled protection circuit 4 is integrated on-chip with the core circuit 3. However, in other embodiments, the actively-controlled protection circuit 4 and the core circuit 3 can be fabricated on separate ICs. Thus, one or more actively-controlled protection circuits can be placed in a stand-alone IC, in a common package for system on a package (SOP) applications, or integrated with a core circuit on a common semiconductor substrate for system on a chip (SOC) applications.

The IC 10 can be used in, for example, high speed/high power data converter applications, high speed radio frequency (RF) applications, or a variety of other applications. The IC 10 can be utilized in electronic systems in which the pins of the IC are exposed, for example, to IC assembly conditions that generate field-induced discharges, mechanical conductive tools for handling and testing, and/or direct user contact through a low-impedance connection.

Figure 1B:
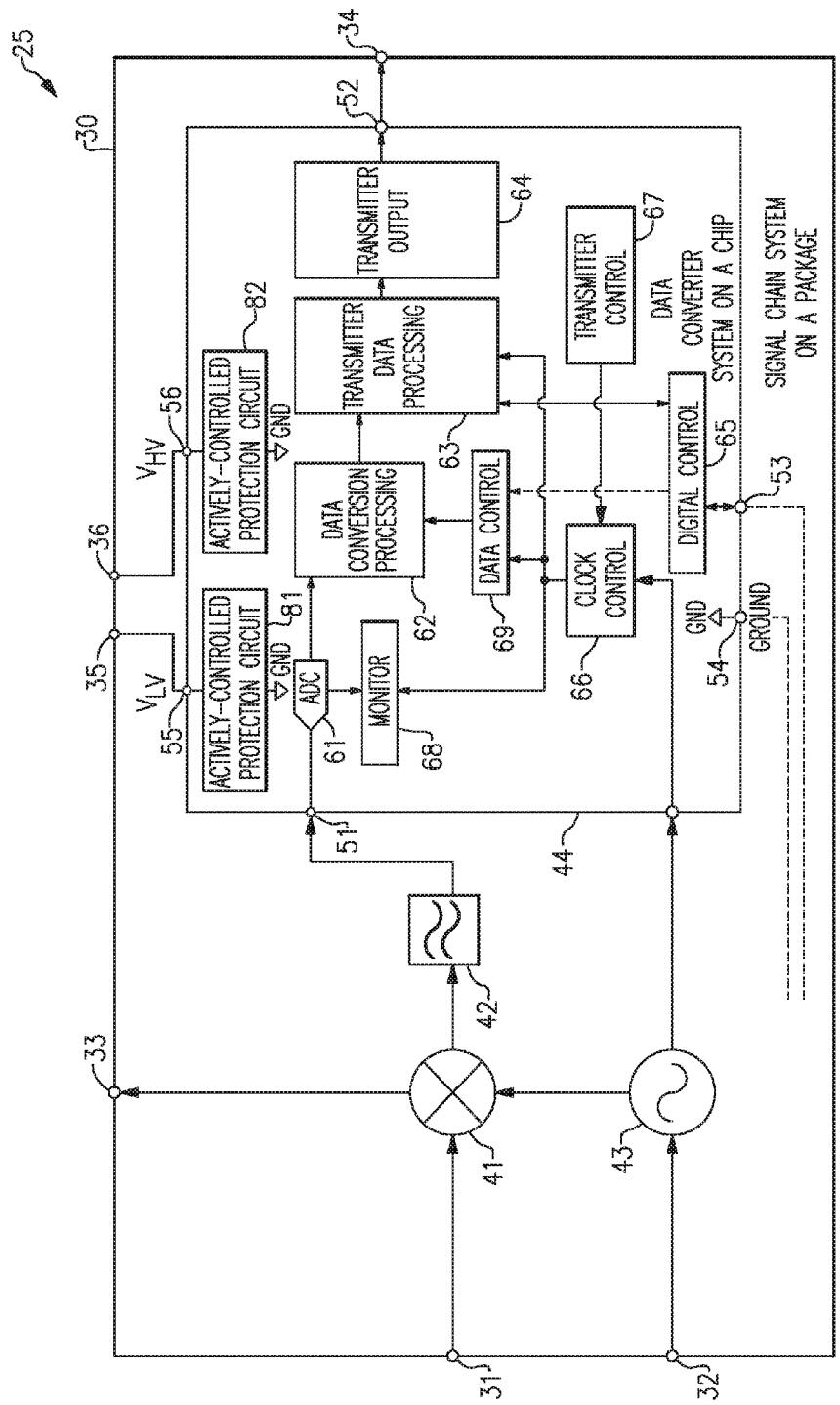
FIG. 1B is a schematic diagram of a signal chain system on a package (SOP) in accordance with one embodiment.

FIG. 1B is a schematic diagram of a signal chain system on a package (SOP) 25 in accordance with one embodiment. The signal chain SOP 25 includes a package substrate 30 including a mixer 41, a filter 42, a local oscillator 43, and a data converter system on a chip (SOC) 44 attached thereto. The signal chain SOP 25 further includes a data package pin 31, a reference clock package pin 32, a mixer output package pin 33, a data converter output package pin 34, a low voltage power supply package pin 35, and a high voltage power supply package pin 36. Although not illustrated in FIG. 1B, the signal chain SOP 25 can include more or fewer components, pins, and/or other structures, and/or can be arranged in other ways.

The data converter SOC or data converter IC 44 includes a data input pin 51, a data output pin 52, an interface pin 53, a ground pin 54, a low voltage supply pin 55, and a high voltage supply pin 56. The data converter IC 44 further includes an analog-to-digital converter (ADC) 61, a data conversion processing circuit 62, a transmitter data processing circuit 63, and a transmitter output circuit 64, which operate in cascade in a data conversion signal path. The data conversion signal path serves to convert analog data received from the filter 42 on the data input pin 51 to digital data provided on the data output pin 52. The data converter IC 44 further includes a digital control circuit 65, a clock control circuit 66, a transmitter control circuit 67, a monitor circuit 68, and a data control circuit 69, which collectively operate to control data conversion operations along the data conversion signal path.

The data converter IC 44 further includes a first actively-controlled protection circuit 81 and a second actively-controlled protection circuit 82. The first actively-controlled protection circuit 81 operates as a supply clamp between a low voltage supply $V_{LV}$ received on the low voltage supply pin 55 and a ground voltage GND received on the ground pin 54. Additionally, the second actively-controlled protection circuit 82 operates as a supply clamp between a high voltage supply $V_{HV}$ received on the high voltage supply pin 56 and the ground voltage GND. Although FIG. 1B illustrates a configuration including two actively-controlled protection circuits operating as supply clamps, an IC can include more or fewer actively-controlled protection circuits and/or actively-controlled protection circuits arranged in other ways.

The signal chain SOP 25 of FIG. 1B illustrated one example of an electronic system that can operate with high speed/high power signaling. The ADC 61 can receive power in a variety of ways, such as by being powered by a voltage difference between the high voltage supply $V_{HV}$ and the ground voltage and/or by a voltage difference between the low voltage supply $V_{LV}$ and the ground voltage. Transient switching of the ADC 61 can generate supply noise that can inadvertently activate the first and/or second actively-controlled protection circuits 81, 82 during operation of the data converter IC 44. As described herein, the actively-controlled protection circuits 81, 82 can be implemented with a false condition shutdown circuit that generates a false condition shutdown signal indicating when the data converter IC 44 and ADC 61 is powered. When power is present, the false condition shutdown signal inhibits the protection circuit's bias circuit from turning on the protection circuit's clamp circuit. Thus, when the clamp circuit is inadvertently activated by high power/high speed switching of the ADC 61, the false condition shutdown signal deactivates the clamp circuit, thereby preventing the clamp circuit from remaining turned on after unintended activation.

Absent a false condition shutdown mechanism, a clamp circuit of an actively-controlled protection circuit may be inadvertently activated by high power/high speed signaling and remain turned on indefinitely.

However, when the data converter IC 44 is unpowered, the false condition shutdown signal is deactivated. Accordingly, during ESD testing or handling, the false condition shutdown circuit does not inhibit the bias circuit from turning on the clamp circuit when a transient overstress event is detected. Thus, the false condition shutdown circuit has a relatively small or no impact on ESD robustness.

Additional details of the signal chain SOP 25 can be as described herein.

Figure 2:
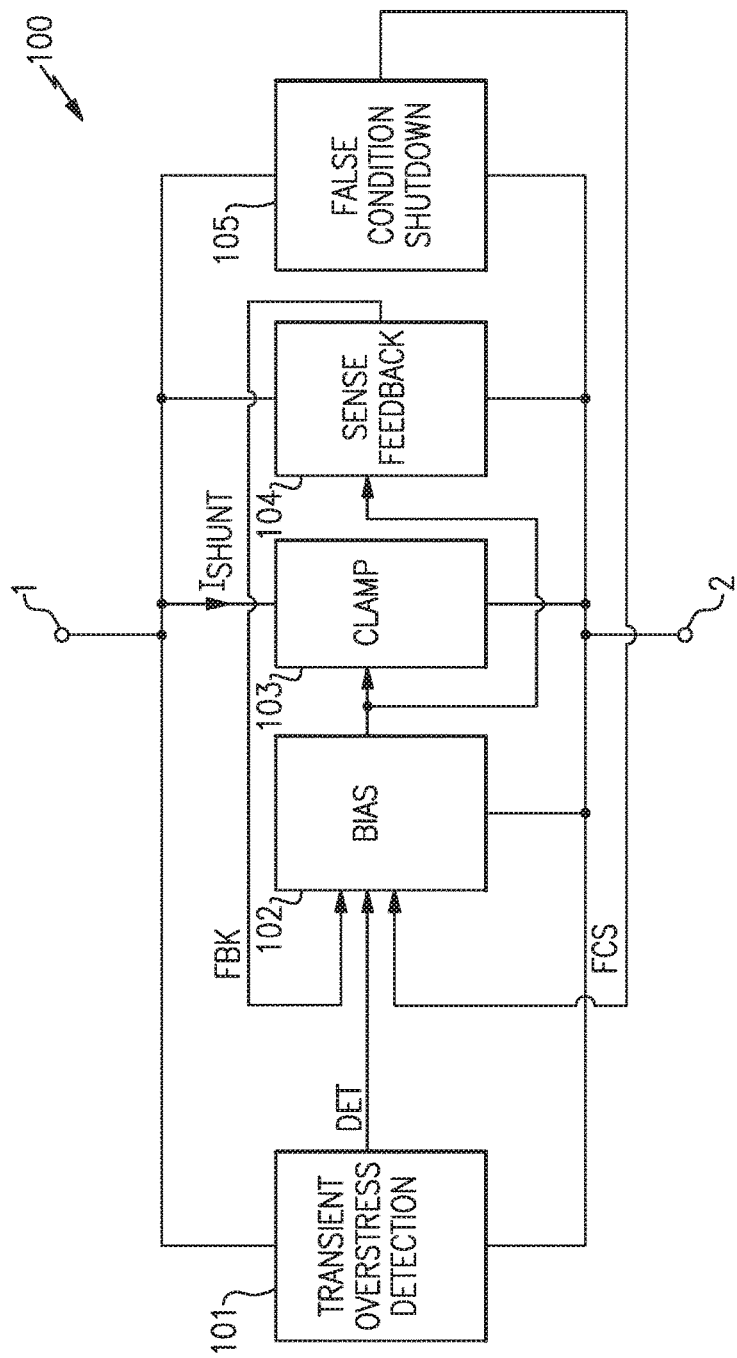
FIG. 2 is a schematic diagram of an actively-controlled protection circuit according to one embodiment.

FIG. 2 is a schematic diagram of an actively-controlled protection circuit 100 according to one embodiment. The actively-controlled protection circuit 100 includes a transient overstress detection circuit 101, a bias circuit 102, a clamp circuit 103, a sense feedback circuit 104, and a false condition shutdown circuit 105. The actively-controlled protection circuit 100 provides transient overstress protection between a first node 1 and a second node 2.

In certain implementations, the first and second nodes 1, 2 correspond to a supply pin and a ground pin, respectively, of an IC, such as a data converter SOC. Thus, the actively-controlled protection circuit 100 can operate as a supply clamp used to provide transient ESD protection to an IC's power supply rails. However, other configurations are possible.

The transient overstress detection circuit 101 is electrically connected between the first and second nodes 1, 2, and generates a detection signal DET indicating whether or not the presence of a transient overstress event is detected between the first and second nodes 1, 2. In certain configurations, the transient overstress detection circuit 101 observes a rate of voltage change between the first and second nodes 1, 2, and controls the detection signal DET to indicate presence of overstress when a qualifying transient overstress event is detected. However, the transient overstress detection circuit 101 can detect for presence of a transient overstress event based on a multitude of detection conditions indicative of a transient overstress event's potential to damage sensitive electronics, including, but not limited to, observations of power, voltage, current, and/or charge.

In certain implementations, the transient overstress detection circuit 101 determines that a transient overstress event is present in response to detecting a rapidly changing voltage for a sufficient period of time on the first node 1 and/or second node 2. For instance, the transient overstress detection circuit 101 can activate the detection signal DET for transient overstress events having a rate of voltage change in the range of about 0.1 V/ns to about 100 V/ns for a length of time in the range of about 1 ns to about 1000 ns. When a transient overstress event is not detected, the transient overstress detection circuit 101 controls the detection signal DET to a signal level associated with no detection of a transient overstress event, for instance, a current level of about 0 mA.

In certain configurations, after detecting a transient overstress event, the detection signal DET remains active for a predetermined time, for example, a time ranging between about 1 ns to about 1000 ns. In one embodiment, the duration that the detection signal DET remains active after the transient overstress detection circuit 101 detects a transient overstress event is based on a time constant of the transient overstress detection circuit 101, such as a resistor-capacitor (RC) time constant.

In the illustrated configuration, the bias circuit 102 biases the clamp circuit 103 to selectively control the clamp circuit 103 in a low impedance/on state or in a high impedance/off state. As shown in FIG. 2, the bias circuit 102 controls the clamp circuit 103 to the on state or the off state based on the detection signal DET from the transient overstress detection circuit 101, a positive feedback signal FBK from the sense feedback circuit 104, and a false condition shutdown signal FCS from the false condition shutdown circuit 105.

In one embodiment, the detection signal DET, the feedback signal FBK, and the false condition shutdown signal FCS correspond to currents, and the bias circuit 102 receives a combined current corresponding to a sum of the detection signal DET, the feedback signal FBK, and the false condition shutdown signal FCS. However, other configurations are possible.

When the false condition shutdown signal FCS is deactivated, the bias circuit 102 is implemented to turn on the clamp circuit 103 when the detection signal DET indicates that a transient overstress event is present between the first and second nodes 1, 2. When turned on, the clamp circuit 103 provides a low impedance path between the first node 1 and the second node 2, and a shunt current $I_{SHUNT}$ flows through the clamp circuit 103 to provide ESD protection. The shunt current $I_{SHUNT}$ prevents overvoltage conditions by shunting charge that may otherwise lead to voltage build-up and IC damage. In certain configurations, the on state impedance of the clamp circuit 103 can be in the range of about 0.2Ω to about 10Ω.

When turned off, the clamp circuit 103 operates in a low-leakage/high-impedance state. The off state impedance can be in, for example, the range of about 10 kΩ to about 10 GΩ, thereby providing low static power dissipation when the actively-controlled protection circuit 100 is deactivated. Upon detection of a transient overstress event satisfying one or more signaling conditions, such as a particular rate of voltage change, the transient overstress detection circuit 101 activates the detection signal DET for a particular duration of time.

The clamp circuit 103 can be implemented in a variety of ways. For example, the clamp circuit 103 can include protection elements, such as one or more bipolar transistors, SCR devices, and/or FETs, that can be selectively turned on by a bias signal generated by the bias circuit 102. In certain configurations, the clamp circuit 103 can include two or more protection elements that are stacked or arranged in series between the first node 1 and the second node 2. Implementing the clamp circuit 103 in this manner can limit a maximum voltage across each element when the clamp circuit 103 is turned off.

Although the transient overstress detection circuit 101 can serve to detect the arrival and/or presence of a transient overstress event, the transient overstress detection circuit 101 may not remain active for the event's full duration. For instance, in one example, the transient overstress detection circuit 101 may be implemented to activate the detection signal DET for a preselected amount of time that may be shorter that a duration of the transient overstress event. In another example, a transient overstress event may have a rate of voltage change that may be too small for the transient overstress detection circuit 101 to detect toward an end of the transient overstress event. For example, the transient overstress detection circuit 101 may be implemented with detection margin to prevent false activation in response to transient activity that is not a transient overstress event, and thus may activate the detection signal DET only when a detected rate of voltage change is relatively large.

Accordingly, the transient overstress detection circuit 101 may deactivate the detection signal DET prior to the completion of a transient overstress event. When the clamp circuit 103 is turned off with the transient overstress event still present, overvoltage conditions can arise, which in turn can lead to IC damage.

The actively-controlled protection circuit 100 includes the sense feedback circuit 104, which can prevent the clamp circuit 103 from deactivating prematurely by generating a positive feedback signal FBK that is based on the shunt current $I_{SHUNT}$ through the clamp circuit 103.

As shown in FIG. 2, the bias circuit 102 turns on or off the clamp circuit 103 based on the detection signal DET, the positive feedback signal FBK, and the false condition shutdown signal FCS. When the false condition shutdown signal FCS is deactivated, and thus indicates that the IC is powered, the bias circuit 102 can turn on the clamp circuit 103 when at least one of the detection signal DET or the positive feedback signal FBK is activated. Accordingly, the positive feedback signal FBK can maintain the clamp circuit 103 turned on for substantially the full duration of the transient overstress event, even after the detection signal DET is deactivated. Thus, the duration that the clamp circuit 103 is turned on need not be limited by a time constant of the transient overstress detection circuit 101, such as an RC time constant of a triggering network. Thus, the clamp circuit 103 can be turned on for a duration that is independent of a time constant of the transient overstress detection circuit 101.

Accordingly, the sense feedback circuit 104 can provide the actively-controlled protection circuit 100 with a turn on time that can dynamically change based on the duration of the transient overstress event. The positive feedback can maintain the clamp circuit 103 turned on while a shunt current of a sufficient magnitude is flowing through the clamp circuit 103. The actively-controlled protection circuit 100 can be used to safely discharge most or all of a trailing edge of an ESD event to avoid voltage build-up. In certain implementations, positive feedback provided by the sense feedback circuit 104 can maintain the clamp circuit 103 turned on for 70% or more of the duration of the transient overstress event.

In contrast, a protection device that sets a duration that a clamp circuit is turned on based on an RC time constant may be unable to maintain the clamp circuit turned on for a full duration of an ESD event, which can lead to damage of certain devices, such as small geometry devices and/or high speed devices susceptible to overvoltage conditions. For example, prematurely turning off the clamp circuit may damage, for example, metal oxide semiconductor (MOS) transistors having a gate length of 28 nm or less and/or heterojunction bipolar transistors such as silicon germanium (SiGe) bipolar transistors.

The false condition shutdown circuit 105 generates the false condition shutdown signal FCS, which indicates when the IC is powered and the first node 1 and the second node 2 operate with nominal voltage levels. In certain configurations, the false condition shutdown signal FCS overrides the positive feedback signal FBK and the detection signal DET. Thus, when the false condition shutdown signal FCS is activated, the bias circuit 102 turns off the clamp circuit 103.

In other configurations, the bias circuit 102 can turn on the clamp circuit 103 when the magnitude of the detection signal DET is sufficiently large, such as in response to voltage build-up during a transient overstress condition. In such configurations, the actively-controlled protection circuit can provide ESD protection while the part is powered. For example, in a supply clamp implementation, the power supply can be decoupled in part from the first node 1 using a decoupling element such as a resistor, and thus the voltage difference between the first node 1 and second node 2 changes during an ESD event. As the voltage difference between the first and nodes 1, 2 increases, the magnitude of the detection signal DET can increase and eventually override the false condition shutdown signal FCS, thereby resulting in the bias circuit 102 turning on the clamp circuit 103. After passage of the ESD event, the power supply can restore the voltage difference between the first and second nodes 1, 2 to about the nominal voltage difference, and the false condition shutdown circuit 105 can activate the false condition shutdown signal FCS to deactivate the clamp circuit 103.

In one embodiment, the false condition shutdown circuit 105 generates the false condition shutdown signal FCS based on low pass filtering a voltage difference between the first node 1 and the second node 2. Low pass filtering the voltage difference between the first and second nodes 1, 2 helps prevent a voltage overshoot resulting from an ESD event from inadvertently causing the false condition shutdown circuit 105 to detect the presence of power. For example, at the start of an ESD event, the clamp circuit 103 may not have activated yet, and the voltage of the first node 1 may reach an overshoot voltage. By low pass filtering the voltage difference between the first and second nodes 1, 2, the false condition shutdown circuit 105 is prevented from erroneously determining that power is present based on temporary voltage overshoot.

Including the false condition shutdown circuit 105 can enhance the robustness of the actively-controlled protection circuit 100. For example, the false condition shutdown circuit 105 can detect when the IC is powered. Thus, when the clamp circuit 103 is inadvertently activated while the IC is powered, the false condition shutdown circuit 105 deactivates the clamp circuit 103 to prevent the clamp circuit 103 from remaining turned on.

The false condition shutdown circuit 105 can remedy unintended activation of the clamp circuit 103 by shutting down the clamp circuit 103 after the clamp circuit 103 has been inadvertently activated by high power/high speed signaling conditions. For instance, transient switching associated with advanced high power converter applications may inadvertently trigger activation of the clamp circuit 103, and the false condition shutdown circuit 105 can be used to deactivate the clamp circuit 103 after unintended activation. In contrast, an actively-controlled protection circuit implemented without a false condition shutdown circuit may be accidentally triggered and remain turned on indefinitely via positive feedback.

Additional details of the actively-controlled protection circuit 100 can be as described herein.

Figure 3:
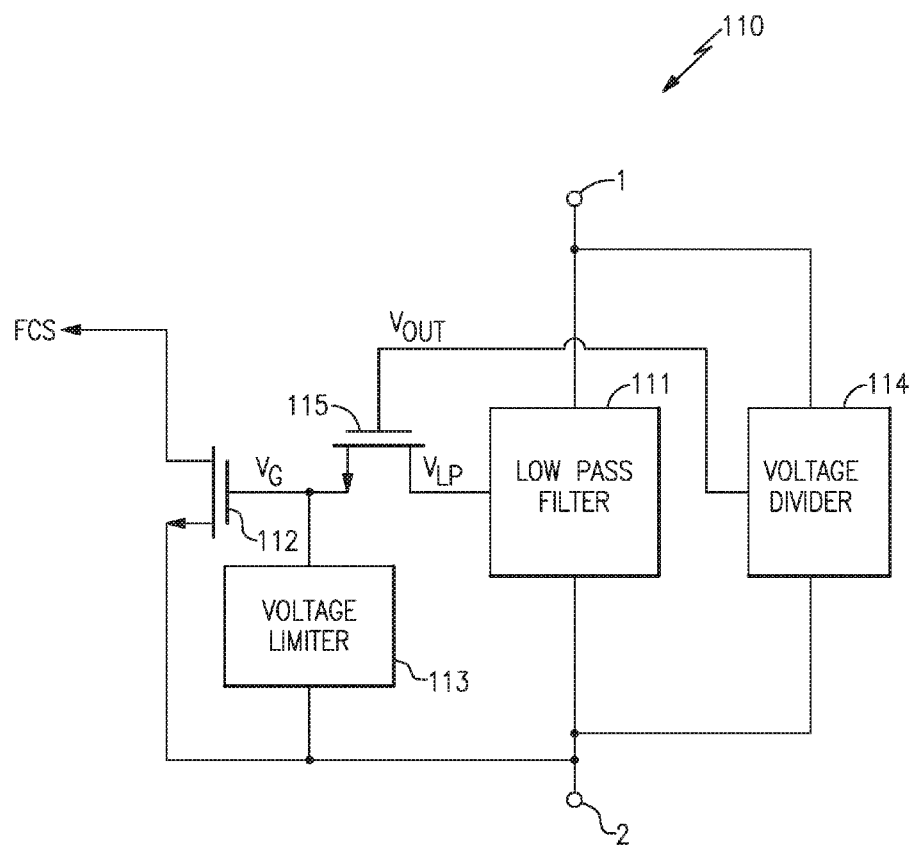
FIG. 3 is a schematic diagram of a false condition shutdown circuit according to one embodiment.

FIG. 3 is a schematic diagram of a false condition shutdown circuit 110 according to one embodiment. The false condition shutdown circuit 110 includes a low pass filter 111, a first n-type field effect transistor (NFET) 112, a voltage limiter 113, a voltage divider 114, and a second NFET 115.

The false condition shutdown circuit 110 illustrates one embodiment of the false condition shutdown circuit 105 of FIG. 2. However, the false condition shutdown circuit 105 of FIG. 2 can be implemented in other ways.

As shown in FIG. 3, the low pass filter 111 is electrically connected between the first node 1 and the second node 2, and generates a low pass filtered voltage $V_{LP}$ corresponding to a low pass filtered voltage difference between the first node 1 and the second node 2. In one embodiment, the low pass filter 111 has a cutoff frequency of less than 100 MHz, for instance in the range of 10 MHz to 50 MHz. However, other cutoff frequencies are possible, including, for example, cutoff frequencies that depend on application and/or implementation.

In the illustrated embodiment, the low pass filtered voltage $V_{LP}$ is provided to a drain of the second NFET 115. The voltage divider 114 is electrically connected between the first node 1 and the second node 2, and generates an output voltage $V_{OUT}$ corresponding to a fraction of the voltage difference between the first node 1 and the second node 2. The output voltage $V_{OUT}$ is provided to a gate of the second NFET 115. The second NFET 115 further includes a source that generates a gate voltage $V_G$ for controlling a gate of the first NFET 112. The first NFET 112 further includes a source electrically connected to the second node 2 and a drain that generates the false condition shutdown signal FCS. The voltage limiter 113 is electrically connected between the gate of the first NFET 112 and the second node 2.

The false condition shutdown circuit 110 generates the false condition shutdown signal FCS, which has a value that changes based on the voltage difference between the first node 1 and the second node 2. As will be described below, the false condition shutdown signal FCS is activated when the first node 1 and the second node 2 operate with a nominal voltage difference associated with the IC being turned on and powered. When the false condition shutdown signal FCS is activated, the false condition shutdown signal FCS inhibits the protection circuit's bias circuit from turning on the protection circuit's clamp circuit. However, when the IC is unpowered, the false condition shutdown signal FCS is deactivated and does not hinder operation of the actively-controlled protection circuit. Accordingly, occurring during ESD testing or handling, the false condition shutdown circuit does not inhibit the bias circuit from turning on the clamp circuit when a transient overstress event is detected.

When a transient overstress condition occurs when the IC is unpowered, the clamp circuit clamps the voltage difference between the first and second nodes 1, 2 at a clamping voltage that is less than the nominal operating voltage between the first and second nodes 1, 2. Thus, the false condition shutdown circuit 110 remains turned off during an overstress event, and the false condition shutdown circuit 110 provides independent shutdown control when the IC is powered with little to no impact on ESD robustness.

In one embodiment, a clamping voltage of an actively-controlled protection circuit is selected to be in the range of 1 V to 15 V, for instance, 5 V and the nominal voltage difference between the first and second nodes 1, 2 is selected to be in the range of 0.5 V to 12 V, for instance 3.5 V. However, other values of clamping voltages and/or nominal voltage differences can be used.

As shown in FIG. 3, the gate of the second NFET 115 is controlled using the output voltage $V_{OUT}$ from the voltage divider 114. Since the output voltage $V_{OUT}$ changes based on the voltage difference between the first node 1 and the second node 2, the gate voltage of the second NFET 115 also changes with the voltage difference between the first node 1 and the second node 2. The low pass filtered voltage $V_{LP}$ also changes with the voltage difference between the first node 1 and the second node 2, and is provided to the drain of the second NFET 115. Additionally, the source of the second NFET 115 controls the gate voltage $V_G$ of the first NFET 112. The false condition shutdown circuit 110 is implemented such that the gate voltage $V_G$ is sufficient to turn on the first NFET 112 when the voltage difference between the first node 1 and the second node 2 is about equal to the nominal voltage difference, and such that the gate voltage $V_G$ is sufficient to turn off the first NFET 112 when the voltage difference between the first node 1 and the second node 2 is less than or equal to the clamping voltage.

In one example, the first node 1 is a power supply voltage of voltage $V_{DD}$ and the second node 2 is a ground voltage of 0 V. When the IC is powered, the output voltage $V_{OUT}$ is controlled to about $\alpha*V_{DD}$, where $\alpha$ corresponds to the input to output voltage ratio of the voltage divider 114. However, when a transient overstress event is present, the protection device's clamp circuit clamps the voltage difference between the first node 1 and the second node 2 to a clamping voltage $V_{CLAMP}$. Accordingly, the output voltage $V_{OUT}$ is controlled to about $\alpha*V_{CLAMP}$ or less when a transient overstress event is present. As skilled artisans will appreciate, the gate voltage $V_G$ of the first NFET 112 changes based on the output voltage $V_{OUT}$ and the low pass filtered voltage $V_{LP}$. For a given nominal voltage difference, suitable values for $\alpha$ and/or the clamping voltage $V_{CLAMP}$ can be selected to turn on the first NFET 112 when the IC is powered and turn off the first NFET 112 during a transient overstress event.

The low pass filter 111 provides low pass filtering to the voltage difference between the first node 1 and the second node 2. Including the low pass filter 111 prevents an initial voltage overshoot associated with finite-turn on time of the protection device's clamp from activating the false condition shutdown signal FCS. For example, at the start of a transient overstress event, a clamp circuit, such as the clamp circuit 103 of FIG. 2, may not have activated yet, and the voltage of the first node 1 may reach an overshoot voltage.

The illustrated voltage limiter 113 is electrically connected between the gate of the NFET 112 and the second node 2, and can be used to reduce or limit voltage build-up on the gate of the NFET 112 during an overstress event. For example, the voltage limiter 113 aids in protecting the first NFET 112 from damage during overshoot. Moreover, when a transient overstress event is present and the clamp circuit is clamping, the voltage limiter 113 aids in pulling down the gate voltage $V_G$ and shutting off the first NFET 112. The second NFET 115 also aids in protecting the gate of the first NFET 112 from damage.

Although FIG. 3 illustrates one example of a false condition shutdown circuit implemented in accordance with the teachings herein, a false condition shutdown circuit can be implemented in a wide variety of ways.

Additional details of the false condition shutdown circuit 110 can be as described herein.

Figure 4:
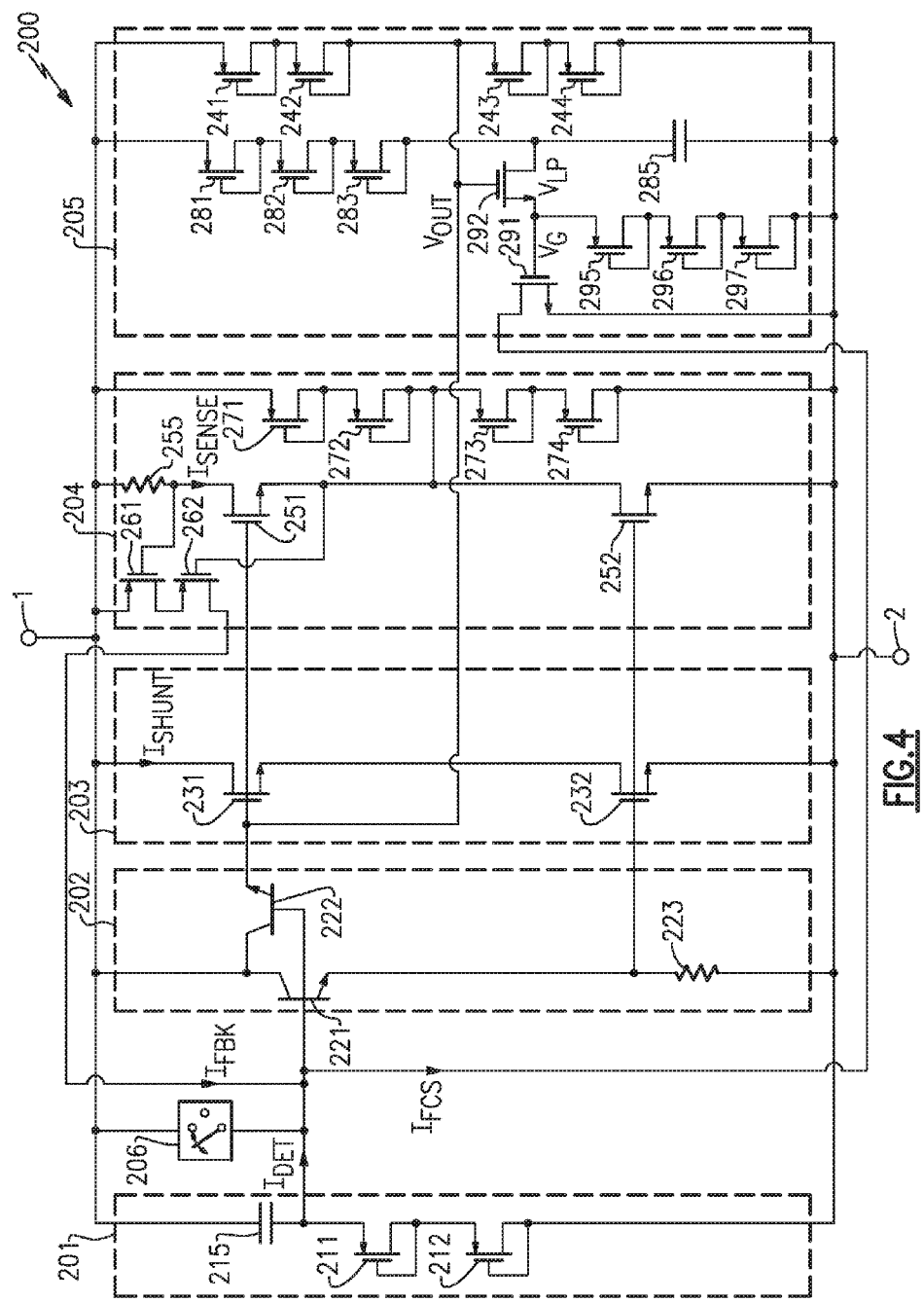
FIG. 4 is a circuit diagram of an actively-controlled protection circuit according to one embodiment.

FIG. 4 is a circuit diagram of an actively-controlled protection circuit 200 according to one embodiment. The actively-controlled protection circuit 200 includes a transient overstress detection circuit 201, a bias circuit 202, a clamp circuit 203, a sense feedback circuit 204, and a false condition shutdown circuit 205. The actively-controlled protection circuit 200 has further been annotated to show an override switch 206, which can be used to force the clamp circuit 203 to turn on. The override switch 206 has been included in the circuit diagram for purposes of the simulation of FIG. 5, and can be omitted.

In certain applications, a nominal voltage difference between the first node 1 and the second node 2 can be greater than a breakdown voltage of a particular device, such as a metal oxide semiconductor (MOS) transistor. In the illustrated configuration, the actively-controlled protection circuit 200 includes MOS transistors that have been placed in series in this manner to prevent overvoltage conditions. Alternative embodiments can use higher voltage devices and omit a series arrangement.

The illustrated transient overstress detection circuit 201 includes a first detection p-type metal oxide semiconductor (PMOS) transistor 211, a second detection PMOS transistor 212, and a detection capacitor 215. The detection PMOS transistors 211, 212 are each diode-connected. Additionally, the detection capacitor 215, the first detection PMOS transistor 211, and the second detection PMOS transistor 212 are electrically connected in series with one another between the first node 1 and the second node 2. The transient overstress detection circuit 201 has an R*C time constant associated with a capacitance of the detection capacitor 215 and a resistance of the first and second detection PMOS transistors 211, 212. As shown in FIG. 4, the transient overstress detection circuit 201 generates a detection current $I_{DET}$, which indicates whether or not the transient overstress detection circuit 201 has detected a presence of a transient overstress event between the first node 1 and the second node 2. The detection current $I_{DET}$ is provided to an input of the bias circuit 202.

The illustrated transient overstress detection circuit 201 operates to detect a transient overstress event having a particular rate of voltage change. For example, a displacement current flows through the detection capacitor 215 when a transient overstress event causes the voltage between the first and second nodes 1, 2 to change. When the rate of voltage change is of sufficient magnitude and duration, the detection circuit $I_{DET}$ can be sufficiently large to control the bias circuit 202 to turn on the clamp circuit 203.

The illustrated bias circuit 202 includes a first bias NPN transistor 221, a second bias NPN transistor 222, and a bias resistor 223. Additionally, the illustrated clamp circuit 203 includes a first clamp n-type metal oxide semiconductor (NMOS) transistor 231 and a second clamp NMOS transistor 232. The bias circuit 202 controls the gate voltages of the first and second clamp NMOS transistors 231, 232. In response to a sufficiently large input current, the bias circuit 202 turns on the clamp circuit 203 by increasing the gate voltages of the first and second clamp NMOS transistors 231, 232.

The first and second NMOS clamp transistors 231, 232 are electrically connected in series between the first node 1 and the second node 2. When the bias circuit 202 controls the clamp circuit 203 to the off state, the first and second NMOS clamp transistors 231, 232 provide high impedance between the first node 1 and the second node 2. However, when the bias circuit 202 controls the clamp circuit 203 to the on state, the first and second NMOS transistors 231, 232 operate to clamp the first node 1 to the second node 2. Thus, a low impedance path is provided between the first node 1 to the second node 2, and a shunt current $I_{SHUNT}$ flows through the clamp circuit 203.

The sense feedback circuit 204 includes a first sense NMOS transistor 251, a second sense NMOS transistor 252, a sense resistor 255, a first feedback PMOS transistor 261, a second PMOS transistor 262, a first voltage divider PMOS transistor 271, a second voltage divider PMOS transistor 272, a third voltage divider PMOS transistor 273, and a fourth voltage divider PMOS transistor 274.

The sense resistor 255, the first sense NMOS transistor 251, and the second sense NMOS transistor 252 are electrically connected in series between the first node 1 and the second node 2. Additionally, the gate of the first sense NMOS transistor 251 is electrically connected to the gate of the first clamp NMOS transistor 231, and the gate of the second sense NMOS transistor 252 is electrically connected to the gate of the second clamp NMOS transistor 232. Thus, the sense NMOS transistors 251, 252 are implemented to mirror the shunt current $I_{SHUNT}$ flowing through the clamp NMOS transistors 231, 232. In the illustrated embodiment, the sense current $I_{SENSE}$ corresponds to a scaled-down replica of the shunt current $I_{SHUNT}$.

The sense current $I_{SENSE}$ flows through the sense resistor 255, and a voltage drop across the sense resistor 255 is used to control a gate voltage of the first feedback PMOS transistor 261. The first and second feedback PMOS transistors 261, 262 are electrically connected in series between the first node 1 and the input to the bias circuit 202. Additionally, the first to fourth voltage divider PMOS transistors 271-274 are electrically connected in series with one another between the first node 1 and the second node 2. The voltage divider PMOS transistors 271-274 are each diode-connected, and collectively operate to generate a bias voltage for the gate of the second feedback PMOS transistor 262, the source of the first sense NMOS transistor 251, and the drain of the second NMOS sense transistor 252.

When the clamp circuit 203 is turned on, the sense feedback circuit 204 mirrors the shunt current $I_{SHUNT}$ through the clamp circuit 203 to generate the sense current $I_{SENSE}$. Additionally, when a product of the sense current $I_{SENSE}$ and the resistance of the sense resistor 255 is suffi- ciently large, the first feedback PMOS transistor 261 turns on and a positive feedback current $I_{FBK}$ flows into the input of the bias circuit 202.

Accordingly, when the shunt current $I_{SHUNT}$ is flowing, the sense current $I_{SENSE}$ also flows through the first and second NMOS sense feedback transistors 251, 252 and the sense feedback resistor 255. When the sense current $I_{SENSE}$ has a sufficient magnitude, the voltage drop across the sense feedback resistor 255 is large enough to turn on the first PMOS sense feedback transistor 261 and result in a flow of the positive feedback detection current $I_{FBK}$ from the drain of the second PMOS sense feedback transistor 262. While the transient overstress event is present, the positive feedback provided by the sense feedback circuit 204 can maintain the clamp circuit 203 turned on. Additional details of the sense feedback circuit 204 can be similar to those described earlier.

The illustrated false condition shutdown circuit 205 includes a first NMOS transistor 291, a second NMOS transistor 292, a first filter PMOS transistor 281, a second filter PMOS transistor 282, a third filter PMOS transistor 283, a filter capacitor 285, a first voltage divider PMOS transistor 241, a second voltage divider PMOS transistor 242, a third voltage divider PMOS transistor 243, a fourth voltage divider PMOS transistor 244, a first voltage limiter PMOS transistor 295, a second voltage limiter PMOS transistor 296, and a third voltage limiter PMOS transistor 297. Although one example of a false condition shutdown circuit is shown, other configurations of false condition shutdown circuits can be used.

The filter PMOS transistors 281-283 are each diode-connected. The filter PMOS transistors 281-283 and the filter capacitor 285 are electrically connected in series with one another between the first node 1 and the second node 2, and operate as a low pass filter that generates a low pass filtered voltage $V_{LP}$. The low pass filtered voltage $V_{LP}$ corresponds to a low pass filtered difference in voltage between the first node 1 and the second node 2. An amount of filtering of the low pas filter is controlled based on the resistance of the filter PMOS transistors 281-283 and a capacitance of the filter capacitor 285.

The voltage divider PMOS transistors 241-244 are each diode-connected. The voltage divider PMOS transistors 241-244 are electrically connected in series with another between the first node 1 and the second node 2, and operate as a voltage divider that generates an output voltage $V_{OUT}$ that is about one-half the voltage difference between the first node 1 and the second node 2, in this example. The output voltage $V_{OUT}$ is provided to the gate of the second NMOS transistor 292. In illustrated embodiment, the output voltage $V_{OUT}$ is also provided to the gate of the first clamp NMOS transistor 231. Configuring the actively-controlled protection circuit 200 in this manner can aid in reducing size and/or cost of the protection circuit by sharing circuitry.

The second NMOS transistor 292 includes a drain that receives the low pass filtered voltage $V_{LP}$ and a source that generates a gate voltage $V_G$ for a gate of the first NMOS transistor 291. Since both the output voltage $V_{OUT}$ and the low pass filtered voltage $V_{LP}$ change based on the voltage difference between the first node 1 and the second node 2, the gate voltage $V_G$ also changes with the voltage difference between the first node 1 and the second node 2.

The false condition shutdown circuit 205 is implemented such that the gate voltage $V_G$ is sufficiently high to turn on the first NMOS transistor 291 when the voltage difference between the first node 1 and the second node 2 is about equal to a nominal voltage difference associated with the IC being powered. Additionally, the false condition shutdown circuit 205 is implemented such that the gate voltage $V_G$ is sufficiently low to turn off the first NMOS transistor 291 when the IC is unpowered, including when a transient overstress event is present. For example, during ESD testing when the clamp circuit 203 is clamping, the voltage difference between the first node 1 and the second node 2 is less than or equal to the clamping voltage of the clamp circuit 203. By implementing the clamping voltage to be less than the nominal voltage difference between the first and second nodes 1, 2, the false condition shutdown circuit 205 does not inadvertently shut down the clamp circuit 203 when an ESD event is present.

The first NMOS transistor 291 includes a source electrically connected to the second node 2 and a drain that generates a false condition shutdown current $I_{FCS}$, which is provided to the input of the bias circuit 202 in this embodiment. The magnitude of the false condition shutdown current $I_{FCS}$ changes based on the voltage difference between the first node 1 and the second node 2. In particular, when the IC is powered and the first node 1 and the second node 2 operate with a nominal voltage difference, the first NMOS transistor 291 is turned on and the false condition shutdown current $I_{FCS}$ flows therethrough. However, when the IC is unpowered, the first NMOS transistor 291 is turned off and the false condition shutdown current $I_{FCS}$ is about equal to 0 mA. When the IC is unpowered and an ESD event occurs, the clamp circuit 203 is turned on and clamps the first node 1 and the second node 2, thereby controlling the voltage difference between the first node 1 and the second node 2 to be less than or equal to the clamping voltage of the clamp circuit 203. Since the clamping voltage is less than the nominal voltage difference, the false condition shutdown current $I_{FCS}$ remains at about 0 mA when an ESD event is present. Configuring the false condition shutdown circuit 205 in this manner prevents the false condition shutdown circuit 205 from inadvertently shutting down the clamp circuit 203 during an ESD event.

Thus, the false condition shutdown circuit 205 generates the false condition shutdown current $I_{FCS}$, which has a current level that changes based on the voltage difference between the first node 1 and the second node 2. When the IC receives power, the false condition shutdown current $I_{FCS}$ is activated and inhibits the bias circuit 202 from turning on the clamp circuit 203. However, when the IC is unpowered, the false condition shutdown current $I_{FCS}$ is deactivated and has a current level of about 0 mA. Additionally, the clamping voltage is selected to be sufficiently low such that the false condition shutdown circuit 205 does not inadvertently activate the false condition shutdown current $I_{FCS}$ when the clamp circuit 203 is providing clamping during an ESD event. Thus, the false condition shutdown circuit 205 remains turned off during an ESD event, thereby providing independent shutdown control when the IC is powered with little to no impact on ESD robustness.

The illustrated voltage limiter PMOS transistors 295-297 are each diode-connected, and are electrically connected in series with one another between the gate of the first NMOS transistor 291 and the second node 2. The voltage limiter PMOS transistors 295-297 reduce or limit voltage build-up on the gate of the first NMOS transistor 291 during an overstress event, such as during an initial voltage overshoot. Additionally, when a transient overstress event is present and the clamp circuit 203 is clamping, the voltage limiter PMOS transistors 295-297 pull down the gate voltage $V_G$ and help shut off the first NMOS transistor 291.

Figure 5:
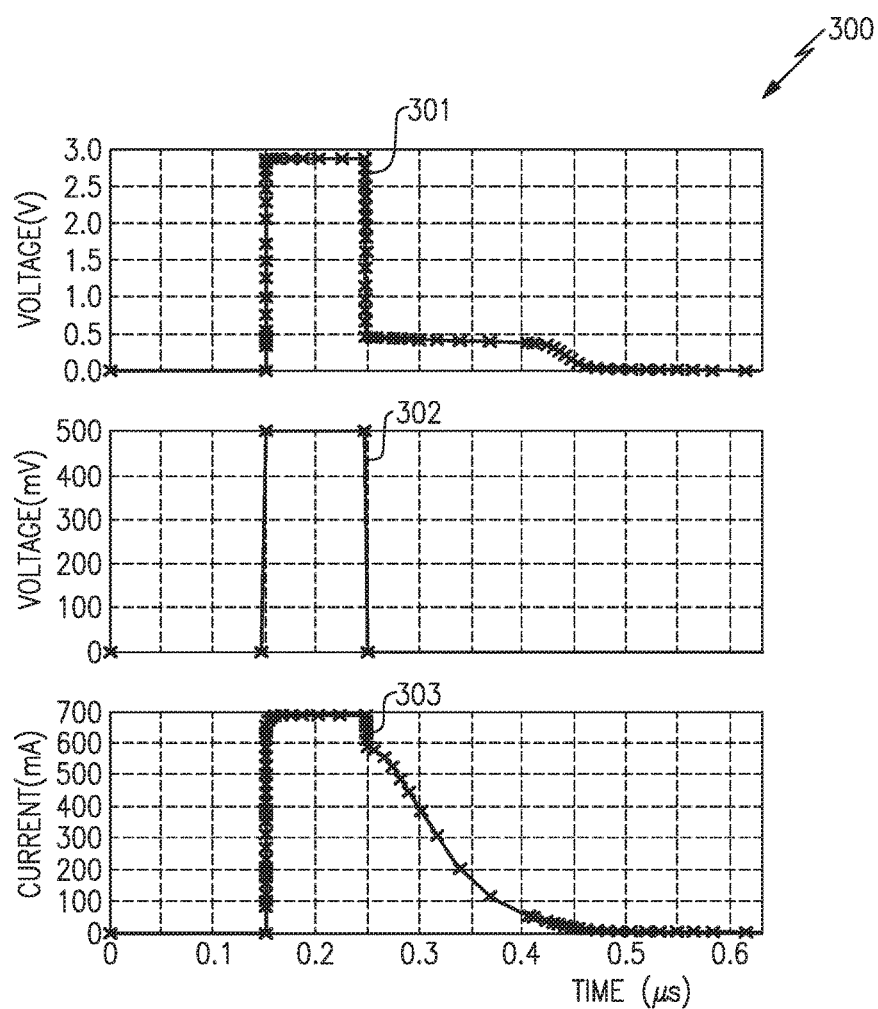
FIG. 5 is a graph of one example of current and voltage versus time for an actively-controlled protection circuit according to one embodiment.

FIG. 5 is a graph 300 of one example of current and voltage versus time for an actively-controlled protection circuit according to one embodiment. The graph 300 corresponds to simulated results for one implementation of the actively-controlled protection circuit 200 of FIG. 4. However, other results are possible, including results that depend on application, circuit implementation, and/or manufacturing process.

The graph 300 includes a first plot 301 of voltage versus time for the input voltage of bias circuit 202 of FIG. 4. Additionally, the graph 300 includes a second plot 302 of voltage versus time for a control input to the override switch 206 of FIG. 4. Furthermore, the graph 300 includes a third plot 303 of current versus time for the shunt current $I_{SHUNT}$ of FIG. 4.

As shown in FIG. 5, the override switch 206 is used to temporarily force the bias circuit 202 to turn on the clamp circuit 203. Activating the clamp circuit 203 in this manner simulates the impact of a sudden increase in the input voltage of the bias circuit 202, such as a voltage increase that can arise from high power/high speed signaling during operation of a data converter SOC. As shown in FIG. 5, the clamp circuit 203 is forced on by the override switch 206. However, after the override switch 206 is deactivated, the false condition shutdown circuit 205 detects that power is present to the IC and shuts down the clamp circuit 203 via the input to the bias circuit 202.

Figure 6:
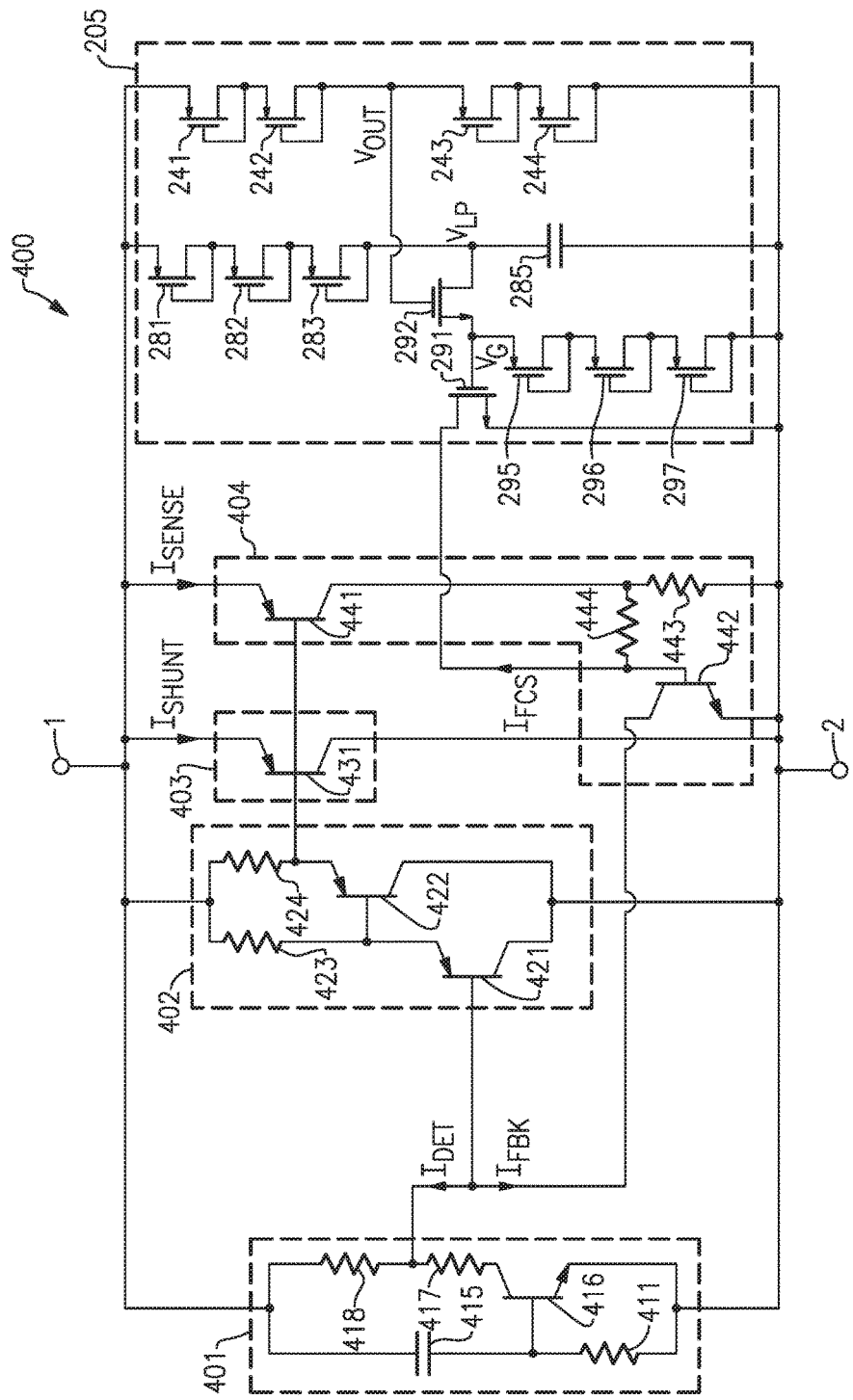
FIG. 6 is a schematic diagram of an actively-controlled protection circuit according to another embodiment.

FIG. 6 is a schematic diagram of an actively-controlled protection circuit 400 according to another embodiment. The actively-controlled protection circuit 400 includes a transient overstress detection circuit 401, a bias circuit 402, a clamp circuit 403, and a sense feedback circuit 404. Additionally, the actively-controlled protection circuit 400 includes the false condition shutdown circuit 205, which can be as described earlier.

The transient overstress detection circuit 401 includes a first detection resistor 411, a detection capacitor 417, a detection NPN transistor 416, a second detection resistor 417, and a third detection resistor 418. The first detection resistor 411 and the detection capacitor 417 are electrically connected in series between the first node 1 and the second node 2, and control a base voltage of the detection NPN transistor 416. When the rate of voltage change between the first and second nodes 1, 2 is of sufficient magnitude and duration, the flow of displacement current from the detection capacitor 415 through the first detection resistor 411 can forward bias the base-to-emitter junction of the detection NPN transistor 416. This in turn, can activate the detection current $I_{DET}$.

The bias circuit 402 includes a first bias PNP transistor 421, a second bias PNP transistor 422, a first bias resistor 423, and a second bias resistor 424. Additionally, the clamp circuit 403 includes a clamp PNP transistor 431. When the detection current $I_{DET}$ is activated and reaches the input of the bias circuit 402, the bias circuit 402 amplifies the detection current $I_{DET}$ to turn on the clamp PNP transistor 431. When turned on, a shunt current $I_{SHUNT}$ flows through the clamp PNP transistor 431 to provide overstress protection.

The sense feedback circuit 404 includes a sense PNP transistor 441, a first sense resistor 443, a second sense resistor 444, and a feedback NPN transistor 442. The sense PNP transistor 441 includes a base electrically connected to a base of the clamp PNP transistor 431, and operates to generate the sense current $I_{SENSE}$ by mirroring the shunt current $I_{SHUNT}$. When the sense current $I_{SENSE}$ is sufficiently large, a voltage drop across the first sense resistor 443 is sufficiently large to turn on the feedback NPN transistor 442 to generate a positive feedback current $I_{FBK}$ for the input of the bias circuit 402.

Accordingly, when the shunt current $I_{SHUNT}$ is sufficiently large, the sense feedback circuit 404 can generate the positive feedback current $I_{FBK}$. The positive feedback current $I_{FBK}$ can maintain the clamp circuit 403 turned on, even after the transient overstress detection circuit 401 deactivates the detection current $I_{DET}$. Additionally, when the transient overstress event completes and the shunt current $I_{SHUNT}$ has a relatively small magnitude, the current through the sense PNP transistor 441 can generate a voltage across the first sense resistor 443 that is insufficient to forward bias the feedback NPN transistor's base-to-emitter junction. Thus, the positive feedback current $I_{FBK}$ can deactivate after passage of the transient overstress event, which in turn can result in the bias circuit 402 turning off the clamp circuit 403.

Accordingly, the active feedback provided by the sense feedback circuit 404 can provide the actively-controlled protection circuit 400 with an activation time that is dynamically adapted to the transient overstress event's duration. Additional details of the sense feedback circuit 404 can be similar to those described earlier.

The false condition shutdown circuit 205 generates the false condition shutdown current $I_{FCS}$, which has a current level that changes based on the voltage difference between the first node 1 and the second node 2. When the IC receives power, the false condition shutdown current $I_{FCS}$ is activated and inhibits the bias circuit 402 from turning on the clamp circuit 403. In the illustrated embodiment, the false condition shutdown current $I_{FCS}$ is indirectly provided to the input of the bias circuit 402 via the feedback NPN transistor 442. However, when the IC is unpowered, the false condition shutdown current $I_{FCS}$ is deactivated and has a current level of about 0 mA. Accordingly, the false condition shutdown circuit 205 does not inhibit the bias circuit 402 from turning on the clamp circuit 403 when an ESD event occurs during testing or handling.

When the bias circuit 402 turns on the clamp circuit 403, the clamp circuit 403 clamps the first node 1 and the second node 2. When clamping, the voltage difference between the first node 1 and the second node 2 is less than or equal to the clamp circuit's clamping voltage. The clamping voltage is selected to be less than a nominal voltage difference between the first node 1 and the second node 2 when the IC is powered. Implementing the clamping voltage in this manner prevents the false condition shutdown circuit 205 from inadvertently activating the false condition shutdown current $I_{FCS}$ during an ESD event. Thus, the false condition shutdown current $I_{FCS}$ remains deactivated during an ESD event, and the false condition shutdown circuit 205 provides independent shutdown control when the IC is powered with little to no impact on ESD robustness.

Figure 7:
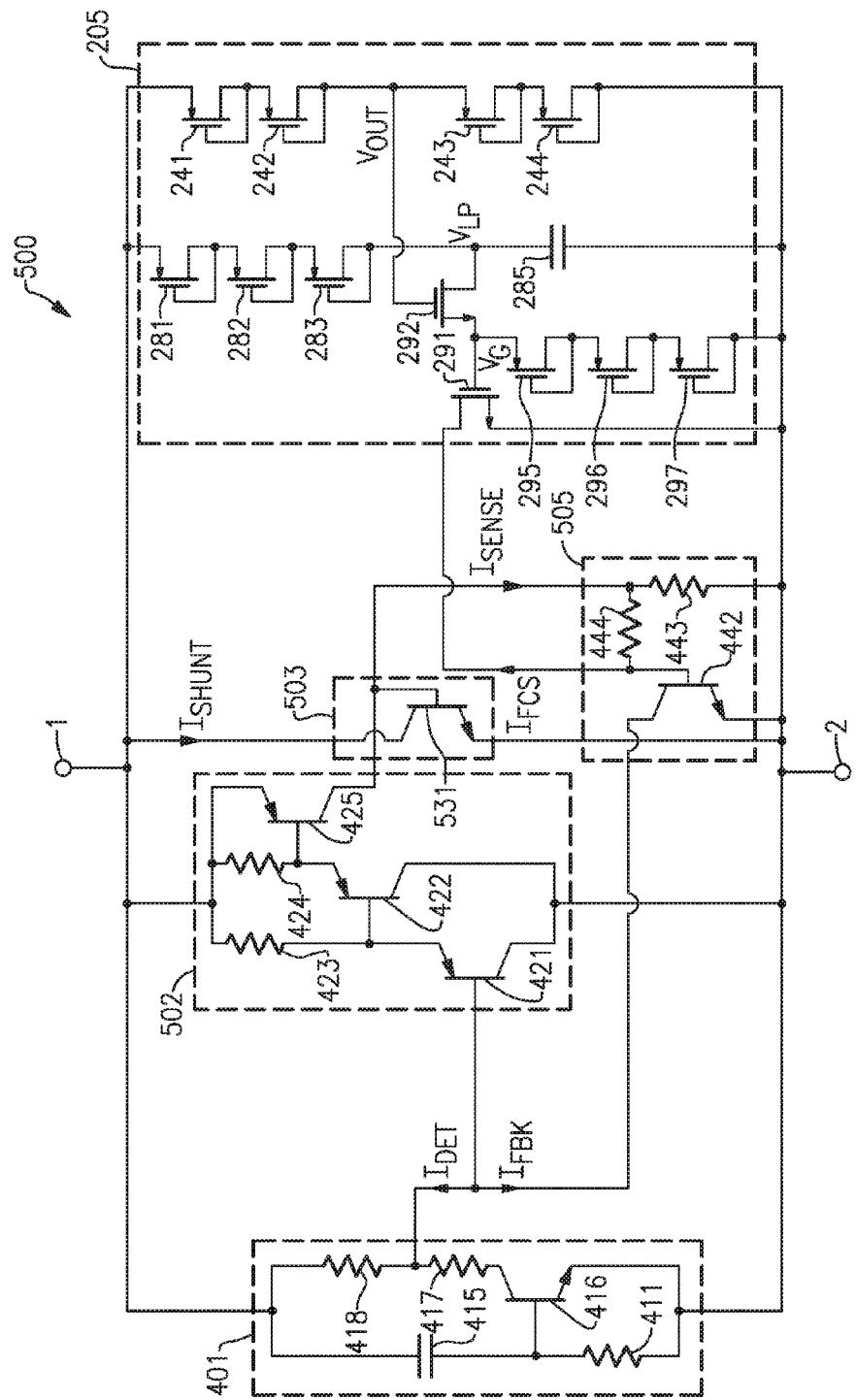
FIG. 7 is a schematic diagram of an actively-controlled protection circuit according to another embodiment.

FIG. 7 is a schematic diagram of an actively-controlled protection circuit 500 according to another embodiment. The actively-controlled protection circuit 500 includes a transient overstress detection circuit 401 and a false condition shutdown circuit 205, which can be as described earlier. The actively-controlled protection circuit 500 further includes a bias circuit 502, a clamp circuit 503, and a sense feedback circuit 505.

The bias circuit 502 includes a first bias PNP transistor 421, a second bias PNP transistor 422, a first bias resistor 423, a second bias resistor 424, and a third bias PNP transistor 425. The sense feedback circuit 505 includes a first sense resistor 443, a second sense resistor 444, and a feedback NPN transistor 442. The clamp circuit 503 includes a clamp NPN transistor 531.

As shown in FIG. 7, the bias circuit 502 receives an input current, and amplifies the input current to generate a bias current for the clamp NPN transistor 531. The bias current generated by the bias circuit 502 can turn on or off the clamp NPN transistor 531, thereby setting the clamp circuit 503 in the on state or the off state. A portion of the bias current is also provided to the sense feedback circuit 505, and serves as the sense current $I_{SENSE}$.

FIGS. 8A-8D are graphs of current and voltage versus time for an actively-controlled protection circuit according to one embodiment. The graphs correspond to simulated results for one implementation of the actively-controlled protection circuit 500 of FIG. 7. However, other results are possible, including results that depend on application, circuit implementation, and/or manufacturing process.

Figure 8A:
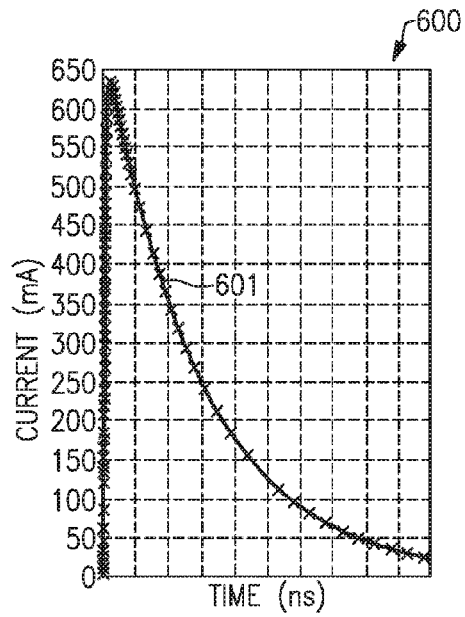
FIGS. 8A-8D are graphs of current and voltage versus time for an actively-controlled protection circuit according to one embodiment.

FIG. 8A includes a first graph 600 including a plot 601 of ESD current versus time for an ESD event starting at time 0 ns. The ESD current is provided to the first node 1 of FIG. 7. Additionally, FIG. 8B includes a second graph 610 including a plot 611 of the voltage difference between the first node 1 and the second node 2 of FIG. 7 versus time. FIGS. 8A and 8B correspond to one simulation of the actively-controlled protection circuit 500 of FIG. 7 in response to an ESD event. In the illustrated example, a clamping voltage of less than 2 V is provided, while the first and second nodes 1, 2 operate with a 3.3 V nominal voltage difference. However, other values of clamping voltages and/or nominal voltage differences can be used.

Figure 8C:
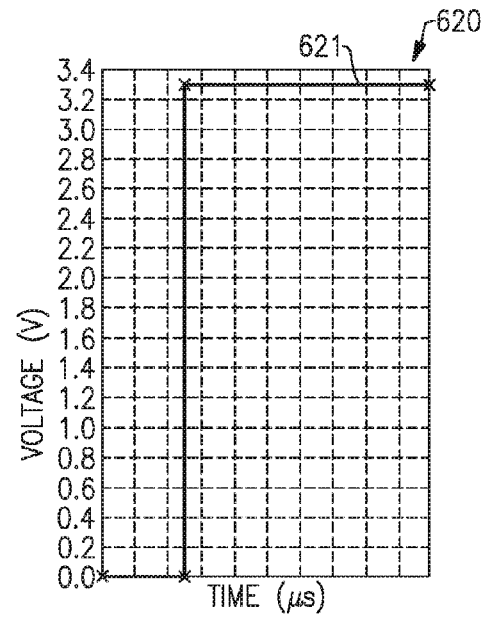
Figure 8B:
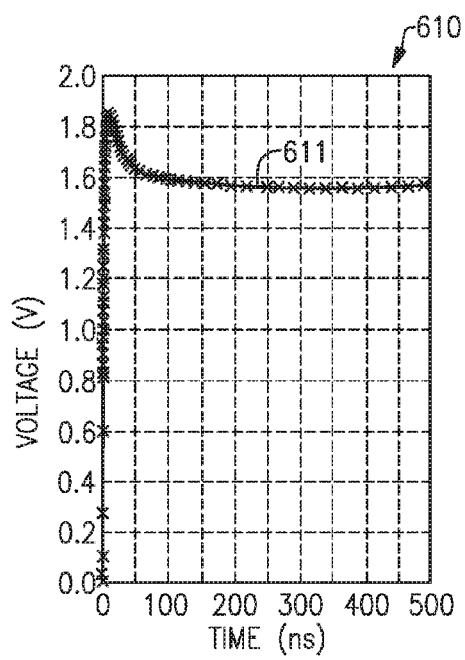
Figure 8D:
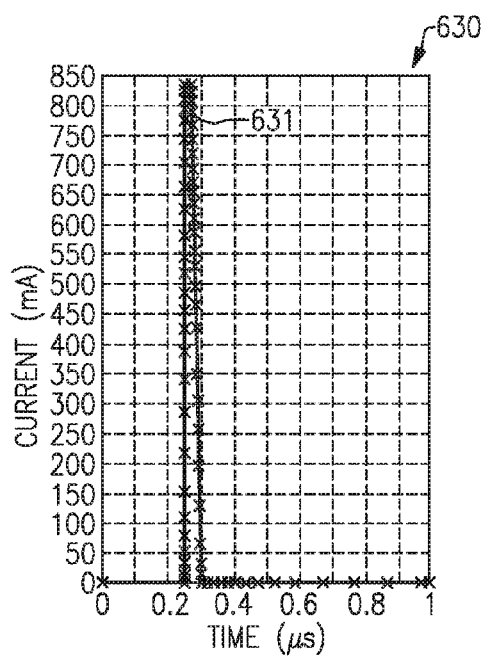

FIG. 8C includes a third graph 620 including a plot 621 of a voltage difference between the first node 1 and the second node 2 of FIG. 7 versus time. Additionally, FIG. 8D includes a fourth graph 630 including a plot 631 of current versus time for the shunt current $I_{SHUNT}$ of FIG. 7. FIGS. 8C and 8D correspond to another simulation of the actively-controlled protection circuit 500 of FIG. 7 in response to power-up sequencing. As shown in FIGS. 8C and 8D, the actively-controlled protection circuit is stable after power-up, showing a relatively small displacement current of less than 850 mA during the transition and lasting for less than 0.05 vs.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit comprising:
    a transient overstress detection circuit configured to generate a detection signal based on detecting a presence of a transient overstress event between a first node and a second node;
    a clamp circuit having an on state and an off state, wherein the clamp circuit is electrically connected between the first node and the second node;
    a false condition shutdown circuit configured to detect when the integrated circuit is powered, wherein the false condition shutdown circuit is configured to generate a false condition shutdown signal based on low pass filtering a voltage difference between the first node and the second node; and
    a bias circuit configured to:
        control operation of the clamp circuit in the on state or the off state based on the detection signal and the false condition shutdown signal and based on a positive feedback signal; and
        control the clamp circuit to be in the on state when the false condition shutdown signal is deactivated and at least one of the detection signal or the positive feedback signal is activated.

2. The integrated circuit of claim 1, wherein the clamp circuit comprises at least one of a metal oxide semiconductor (MOS) transistor or a bipolar transistor.

3. The integrated circuit of claim 1, further comprising a sense feedback circuit configured to generate the positive feedback signal based on an amount of current flowing through the clamp circuit, wherein the bias circuit is further configured to control operation of the clamp circuit in the on state or the off state based on the positive feedback signal.

4. The integrated circuit of claim 3, wherein the bias circuit is configured to control the clamp circuit to the off state when the false condition shutdown signal is activated.

5. The integrated circuit of claim 4, wherein the bias circuit is further configured to maintain the clamp circuit in the on state for a time duration that is greater than a time constant of the transient overstress detection circuit.

6. The integrated circuit of claim 1, wherein the first node comprises a power supply node, and wherein the second node comprises a ground node.

7. The integrated circuit of claim 1, further comprising a core circuit electrically connected between the first node and the second node.

8. The integrated circuit of claim 1, wherein the false condition shutdown circuit comprises a first field effect transistor (FET) and a low pass filter that generates a low pass filtered voltage based on low pass filtering the voltage difference between the first node and the second node, wherein a gate of the first FET is controlled based on the low pass filtered voltage.

9. The integrated circuit of claim 8, further comprising a voltage limiter electrically connected between the gate of the first FET and the second node, wherein the voltage limiter limits a voltage of the gate of the first FET when the transient overstress event is present.

10. The integrated circuit of claim 8, further comprising a second FET including a drain that receives the low pass filtered voltage and a source electrically to the gate of the first FET.

11. The integrated circuit of claim 10, further comprising a voltage divider electrically connected between the first node and the second node and configured to generate an output voltage that controls a gate of the second FET.

12. A method for protecting an integrated circuit from electrical overstress, the method comprising:
    detecting a presence of a transient overstress event between a first node and a second node using a transient overstress detection circuit;
    activating a detection signal in response to detecting the presence of the transient overstress event using the transient overstress detection circuit;
    generating a false condition shutdown signal based on low pass filtering a voltage difference between the first node and the second node using a false condition shutdown circuit;
    turning on a clamp circuit using a bias circuit when the detection signal is activated and the false condition shutdown signal is deactivated;
    turning off the clamp circuit using the bias circuit when the false condition shutdown signal is activated; and
    using the false condition shutdown circuit to inhibit the bias circuit from turning on the clamp circuit in response to transient switching of an analog to digital converter (ADC).

13. The method of claim 12, further comprising providing positive feedback to the bias circuit using a sense feedback circuit, wherein the positive feedback is based on an amount of current flowing through the clamp circuit.

14. The method of claim 12, further comprising receiving a power supply voltage on the first node and a ground voltage on the second node.

15. The method of claim 14, further comprising powering the ADC with the power supply voltage.

16. A data converter system on a chip (SOC), the data converter SOC comprising:
    an analog-to-digital converter (ADC) that receives power from a supply voltage node and a ground node; and
    a supply clamp comprising:
        a transient overstress detection circuit configured to generate a detection signal based on detecting a presence of a transient overstress event between the supply voltage node and the ground node;
        a clamp circuit having an on state and an off state, wherein the clamp circuit is electrically connected between the supply voltage node and the ground node;
        a false condition shutdown circuit configured to generate a false condition shutdown signal based on low pass filtering a voltage difference between the supply voltage node and the ground node;
        a sense feedback circuit configured to generate a positive feedback signal based on an amount of current flowing through the clamp circuit; and
        a bias circuit configured to control operation of the clamp circuit in the on state or the off state based on the detection signal the false condition shutdown signal, and the positive feedback signal.

17. The data converter SOC of claim 16, wherein the false condition shutdown signal is configured to inhibit the bias circuit from controlling the clamp circuit to the on state in response to transient switching of the ADC when the ADC is powered.

18. The data converter SOC of claim 16, wherein the clamp circuit comprises at least one of a metal oxide semiconductor (MOS) transistor or a bipolar transistor.

19. The data converter SOC of claim 16, wherein the bias circuit is configured to control the clamp circuit to the off state when the false condition shutdown signal is activated.

20. The data converter SOC of claim 16, wherein the bias circuit is further configured to maintain the clamp circuit in the on state for a time duration that is greater than a time constant of the transient overstress detection circuit.

* * * * *